(12) United States Patent
Mutnury et al.

(10) Patent No.: US 11,665,811 B2
(45) Date of Patent: May 30, 2023

(54) PRINTED CIRCUIT BOARD WITH SIGNAL INTEGRITY IMMUNITY TO TEMPERATURE

(71) Applicant: Dell Products L.P., Round Rock, TX (US)

(72) Inventors: Bhyrav Mutnury, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/513,976

(22) Filed: Oct. 29, 2021

(65) Prior Publication Data

US 2023/0133833 A1 May 4, 2023

(51) Int. Cl.
*H05K 1/02* (2006.01)
*H05K 1/11* (2006.01)

(52) U.S. Cl.
CPC .......... *H05K 1/0201* (2013.01); *H05K 1/115* (2013.01); *H05K 2201/062* (2013.01); *H05K 2201/09036* (2013.01)

(58) Field of Classification Search
CPC ....... H05K 1/0201–0212; H05K 1/115; H05K 1/116; H05K 2201/062; H05K 2201/09036; H05K 3/4691
See application file for complete search history.

(56) References Cited

U.S. PATENT DOCUMENTS

| | | | | |
|---|---|---|---|---|
| 2003/0128522 A1* | 7/2003 | Takeda | ............ | H05K 1/0201 257/E23.105 |
| 2003/0128532 A1* | 7/2003 | Somei | ............ | H05K 1/0271 361/777 |
| 2003/0196749 A1* | 10/2003 | Japp | ............ | H05K 3/4641 29/592.1 |
| 2008/0190653 A1* | 8/2008 | Tageman | ............ | H05K 1/0204 29/428 |

* cited by examiner

*Primary Examiner* — Roshn K Varghese
(74) *Attorney, Agent, or Firm* — McDermott Will & Emery LLP

(57) ABSTRACT

A system for providing signal temperature immunity to a printed circuit board (PCB) comprises moating a set of reference planes, forming a trench between a heat source and a stripline trace and positioning a perforated section of a plane on a reference plane opposite the heat source. Moating the reference planes increases thermal resistance, the trench removes dielectric material and replaces it with air and the perforated section causes heat to travel in a non-linear path. Vias positioned at the ends of the PCB route heat along the outer surfaces of the PCB to transfer heat to the ambient environment.

10 Claims, 5 Drawing Sheets

PRINTED CIRCUIT BOARD WITH SIGNAL INTEGRITY IMMUNITY TO TEMPERATURE

BACKGROUND

Field of the Disclosure

This disclosure relates generally to information handling systems and, more particularly, to printed circuit boards (PCBs) with signal integrity immunity to temperature.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Joule heating takes place due to current flow in the conductor, while environmental heating is due to the ambient temperature. Resistivity of Cu interconnects increases with increase in temperature. As temperature increases, the random motion of electrons increases, which causes an increase in the resistivity as shown below $$\rho(T)=\rho(T\_0)[1+\beta(T-T\_0)]$$

where, $\rho$ represents resistivity, $\beta$ represents temperature coefficient of resistivity, $T\_0$ is the room temperature (25° C.) and $T$ is the interconnect temperature during operation. Similarly, the dielectric constant of material also increases with increase in temperature. Cables provide a lower loss mode for signal propagation compared to PCB which makes them popular. Internal cables have been popular in rack servers for a while.

SUMMARY

Embodiments disclosed herein may be generally directed a printed circuit board (PCB) for supporting and thermally resisting heat transfer from a heat source mounted on the PCB to protect signal integrity of a high-speed trace. Embodiments of a PCB may comprise a dielectric material having a length between a first end and a second end, a width between a first edge and a second edge and a thickness between a first surface and a second surface, the substrate comprising a plurality of layers. A trench may be formed partially in the dielectric material, wherein at least one layer of the plurality of layers is continuous over the length of the dielectric material, the trench has a depth less than the thickness of the dielectric material, and the trench divides a set of the plurality of layers into a first side and a second side such that the heat source is mounted on the first side of the trench and the high-speed trace is formed on the second side of the trench. A plurality of traces may be formed on the plurality of layers, wherein a first set of traces of the plurality of traces is formed on the first side of the trench, a second set of traces of the plurality of traces is formed on the second side of the trench and a third set of traces of the plurality of traces is formed on the at least one continuous layer. A plurality of vias may be formed in the PCB, each via connecting two or more traces, wherein at least one via is formed on the first side of the trench and is configured to connect the first set of traces and the third set of traces and at least one via is formed on the second side of the trench and is configured to connect the second set of traces and the third set of traces.

In some embodiments, each trace in the third set of traces comprises a perforated ground plate the trench, the ground plate comprising a non-linear path. In some embodiments, the ground plate comprises a plurality of drilled openings defining a curvilinear path. In some embodiments, the ground plate comprises a set of discrete segments.

In some embodiments, a set of mounting holes may be configured for conductive heat transfer from the PCB to a chassis. In some embodiments, the first set of vias are located proximate the first end of the PCB and the second set of vias are located proximate the second end of the PCB. In some embodiments, the heat source is mounted on the first surface and the at least one continuous layer is formed on a second surface opposite the first surface.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
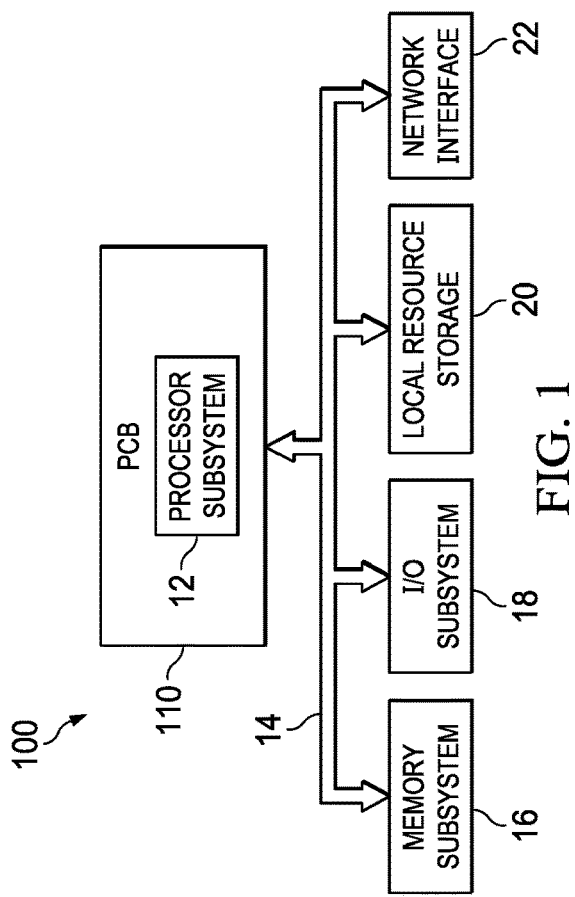
FIG. 1 is a block diagram of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, rack "10-1" refers to an instance of a rack, which may be referred to collectively as racks "10" and any one of which may be referred to generically as rack "10."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Traditional differential pair structures are coupled in one direction; either horizontally (edge coupled) or vertically (broadside coupled), which results in some fringing, since the electromagnetic fields use more space to terminate. This increases crosstalk and lowers density since it requires more space to isolate.

Particular embodiments are best understood by reference to FIGS. 1-6, wherein like numbers are used to indicate like and corresponding parts.

Turning to the drawings, FIG. 1 illustrates a block diagram depicting selected elements of an embodiment of information handling system 100. It is noted that FIG. 1 is not drawn to scale but is a schematic illustration.

As shown in FIG. 1, components of information handling system 100 may include, but are not limited to, a processor subsystem 12, which may comprise one or more processors, and a system bus 14 that communicatively couples various system components to processor subsystem 12 including, for example, a memory subsystem 16, an I/O subsystem 18, local storage resource 20, and network interface 22.

Processor subsystem 12 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 12 may interpret and execute program instructions and process data stored locally (e.g., in memory subsystem 16). In the same or alternative embodiments, processor subsystem 12 may interpret and execute program instructions and process data stored remotely (e.g., in a network storage resource).

System bus 14 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 16 may comprise a system, device, or apparatus operable to retain and retrieve program instructions and data for a period of time (e.g., computer-readable media). Memory subsystem 16 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 18 may comprise a system, device, or apparatus generally operable to receive and transmit data to or from or within information handling system 100. I/O subsystem 18 may represent, for example, a variety of communication interfaces, graphics interfaces, video interfaces, user input interfaces, and peripheral interfaces. In various embodiments, I/O subsystem 18 may be used to support various peripheral devices, such as a touch panel, a display adapter, a keyboard, a touch pad, or a camera 24, among other examples. In some implementations, I/O subsystem 18 may support so-called 'plug and play' connectivity to external devices, in which the external devices may be added or removed while information handling system 100 is operating.

Local storage resource 20 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 22 may be a suitable system, apparatus, or device operable to serve as an interface between information handling system 100 and a network (not shown). Network interface 22 may enable information handling system 100 to communicate over a network using a suitable transmission protocol or standard. In some embodiments, network interface 22 may be communicatively coupled via a network to a network storage resource (not shown). A network coupled to network interface 22 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 22 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to network interface 22 or various components associated therewith may be implemented using hardware, software, or any combination thereof.

Components described above may communicate with each other over channels, wherein each channel may comprise traces on a printed circuit board (PCB).

Figure 2:
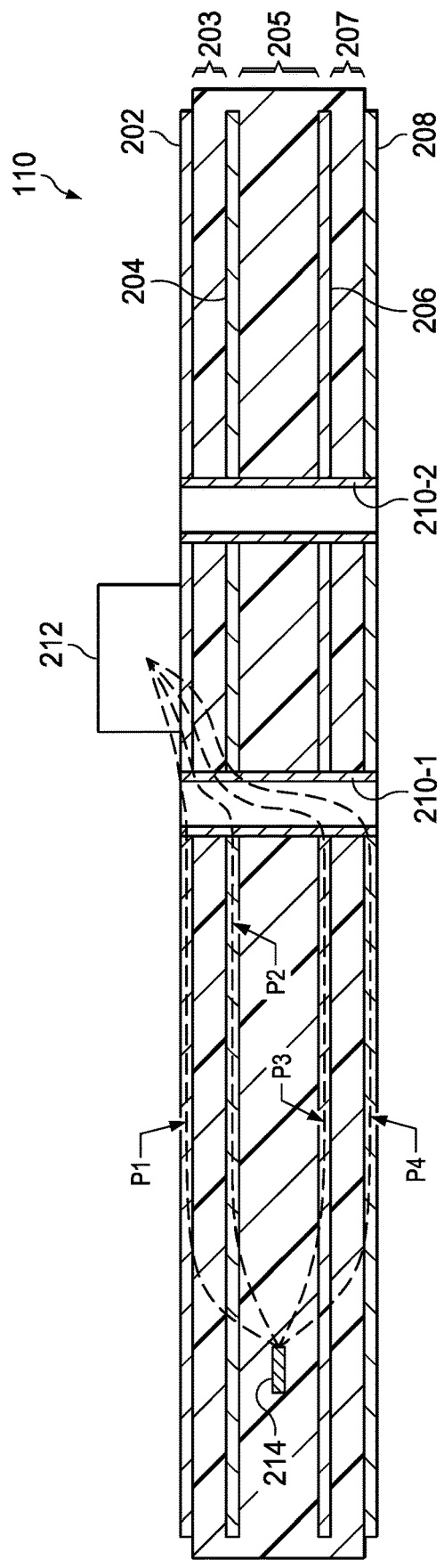
FIG. 2 is a side cutaway view of a printed circuit board (PCB) configured with four layers of traces, illustrating paths for heat transfer from a heat source to a stripline trace.

FIG. 2 depicts a side cross-section view of printed circuit board (PCB) 110 comprising a plurality of traces 202, 204, 206 and 208, a plurality of vias 210 connecting the plurality of traces 202, 204, 206 and 208, a heat source 212 such as a central processing unit (CPU) or other component of processor subsystem 12, and stripline trace 214.

Trace 202 may be formed on a layer defining a first surface of substrate 110, trace 204 may be formed on a layer in substrate 110 and separated from trace 202 by a first distance 203, trace 206 may be formed on a layer in substrate 110 and separated from trace 204 by a second distance 205 and trace 208 may be formed on a layer defining a second surface of substrate 110 and separated from trace 206 by a third distance 207. Each trace 202, 204, 206 and 208 is formed with a conductive material such as copper and defines a pathway for signal communications between components such as a component of processor subsystem 12.

Vias 210 interconnect two or more traces 202, 204, 206 and 208. Vias 210 are commonly formed as holes drilled through substrate 110 and lined with a conductive material such as copper. As depicted in FIG. 2, vias 210 are commonly located near heat source 212, which reduces the distance that a current or signal must travel. Unfortunately, vias 210 also provide a path for heat conduction through PCB 110

High Temperatures Affect Resistivity

Thermal effects are inseparable from interconnect modeling due to self-heating (Joule heating) and environmental heating.

Joule heating takes place due to current flow in traces 202, 204, 206 and 208, wherein the resistivity of copper (Cu) interconnects increases with an increase in temperature. As temperature increases, the random motion of electrons increases, which causes an increase in the resistivity. The resistivity of traces 202, 204, 206 and 208 may be approximated by the equation $$\rho(T) = \rho(T\_0)[1 + \beta(T - T\_0)] \quad (1)$$

where, $\rho$ represents resistivity, $\beta$ represents temperature coefficient of resistivity, $T\_0$ is the room temperature (25° C.) and $T$ is the interconnect temperature during operation. Similarly, the dielectric constant of material also increases with increase in temperature.

Traces and Vias are Pathways for Heat Transmission

As depicted in FIG. 2, as signals and/or electric power are transmitted between heat source 212 and stripline trace 214, paths P1-P4 represent paths for heat conduction from heat source 212 toward stripline trace 214. One major challenge for information handling systems is lowering signal losses associated with traces such as traces 202, 204, 206 and 208. For example, Table 1 contains values for dielectric constant, loss tangent and resistivity. As noted in Table 1, dielectric constant, loss tangent and copper conductivity change with temperature.

TABLE 1

Stripline loss variation due to temperature

| Temperature (° C.) | Dk (Dielectric constant) | Df (Loss tangent) | Resistivity (Ohm-m) |
|---|---|---|---|
| 20 | 4.23 | 0.0124 | 1.72E−08 |
| 60 | 4.26 | 0.0146 | 2.00E−08 |
| 100 | 4.3 | 0.0173 | 2.27E−08 |

The information from Table 1 may be used to model stripline trace 214. The variation in loss can range 15-20% for the above material at different frequencies (e.g., 8 GHz, 16 GHz and 25 GHz) in PCB 110.

Figure 3:
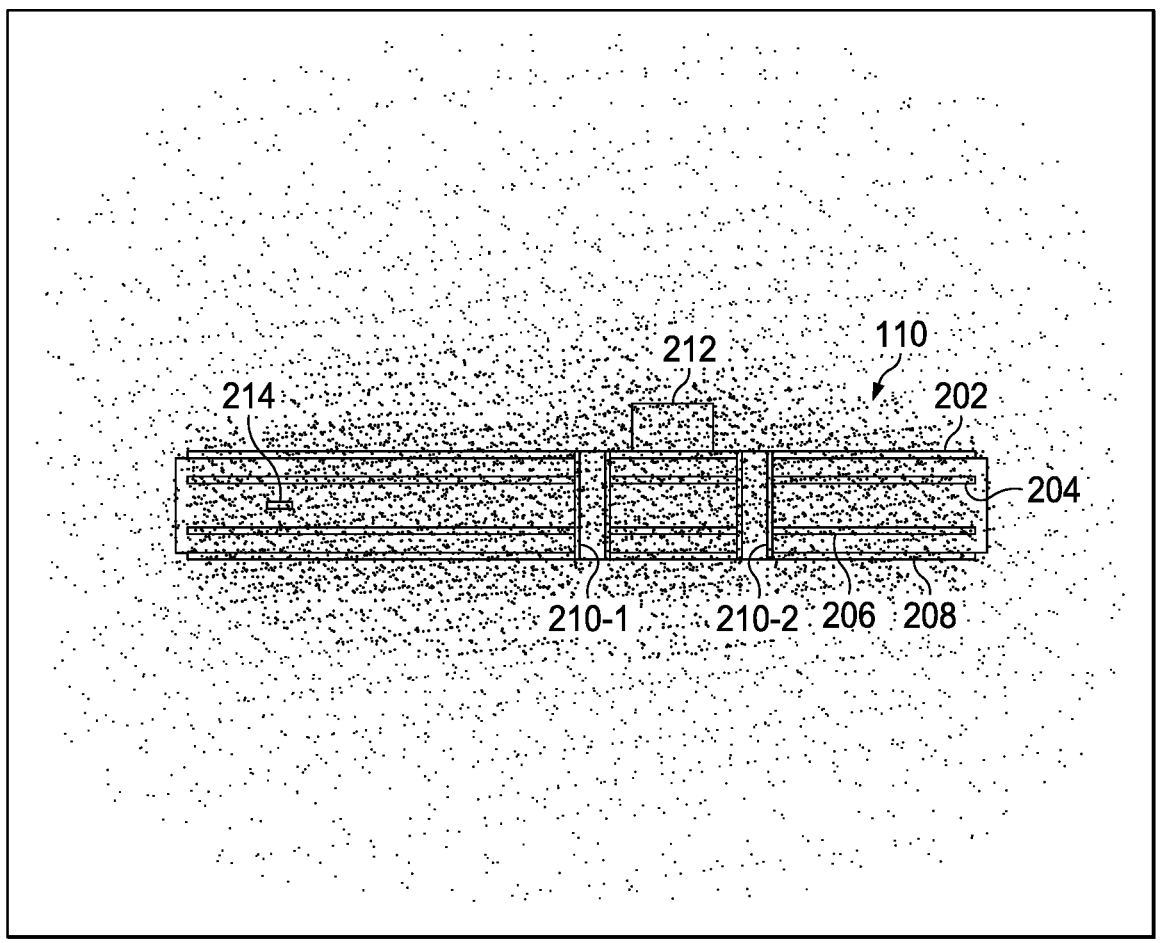
FIG. 3 is a temperature profile of a printed circuit board, illustrating heat distribution in a common design.

FIG. 3 depicts a temperature profile of PCB 110 and the area surrounding PCB 110. As noted in FIG. 3, heat from heat source 212 may be transmitted throughout PCB 110 such that all traces 202, 204, 206 and 208 are affected and PCB 110 may emit heat to the surrounding environment. Thus, every trace 202, 204, 206 and 208 may be affected with increased resistivity, reducing signal integrity.

Embodiments may minimize heat transfer from hot spots to sensitive traces such as stripline trace 214. Embodiments include multiple optimization options that can be used individually or combined for the maximum cumulative benefit.

As disclosed herein, a method to reduce the channel sensitivity to temperature may include one or more of forming a trench in PCB 110, moating one or more reference traces 202, 204 or 206 and configuring a trace 208 with a ground plate having a discontinuous surface. It will be shown that this sensitivity can be significantly reduced with careful design, and this will result in a more robust design for next generation information handling systems 100.

Figure 4:
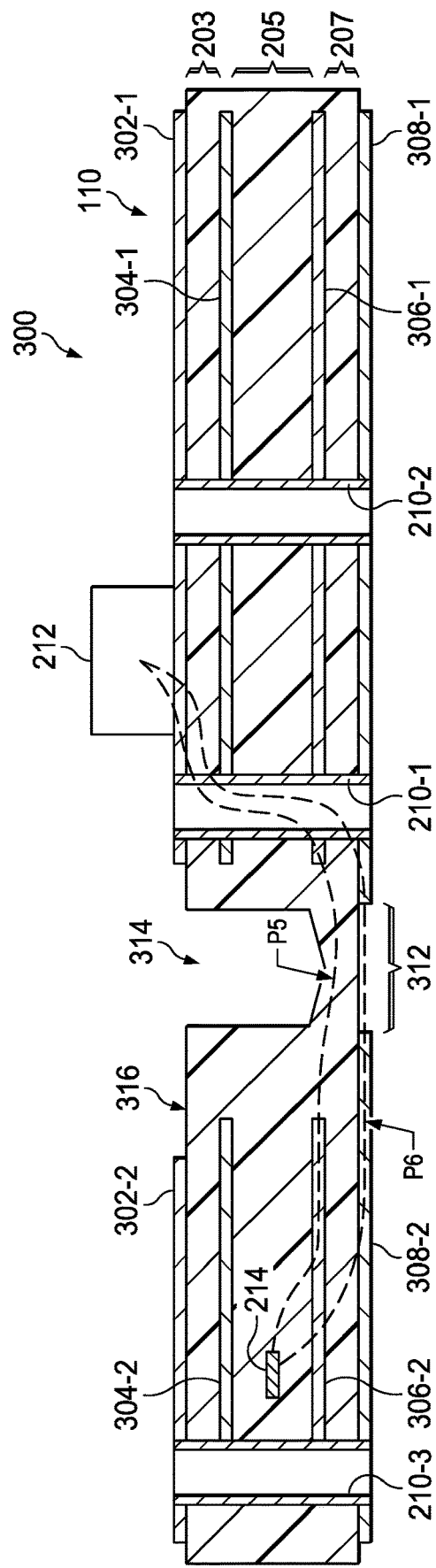
FIG. 4 is a side cutaway view of a printed circuit board (PCB) configured with a trench dividing three layers of traces and moating of traces, illustrating paths for limiting heat transfer from a heat source to a stripline trace.

Moat Reference Planes to Increase Thermal Resistance Between Heat Source and Stripline Trace As depicted in FIG. 4, one or more reference planes may be moated such that each of reference planes 302-2, 304-2 and 306-2 for stripline trace 214 extend from via 210-3 to a length that does not contact via 210-1. By moating the reference planes 302-2, 304-2 and 306-2, heat must travel through dielectric material in PCB 300 to reach stripline trace 214. In some embodiments, if trench 314 is not present (such as in FIG. 2), moating may include removing copper from a portion of traces 202, 204, 206 and 208 between stripline trace 214 and heat source 212.

To ensure current reaches stripline trace 214, via 210-3 may be formed proximate an end of PCB 300. Electric current or signals may travel from via 210-1 through trace 308-2 to via 210-3. By defining a path P6 along trace 308-2 to via 210-3, heat associated with the current is forced to a surface and an end of PCB 110 for easier heat transfer to ambient air.

Figure 5:
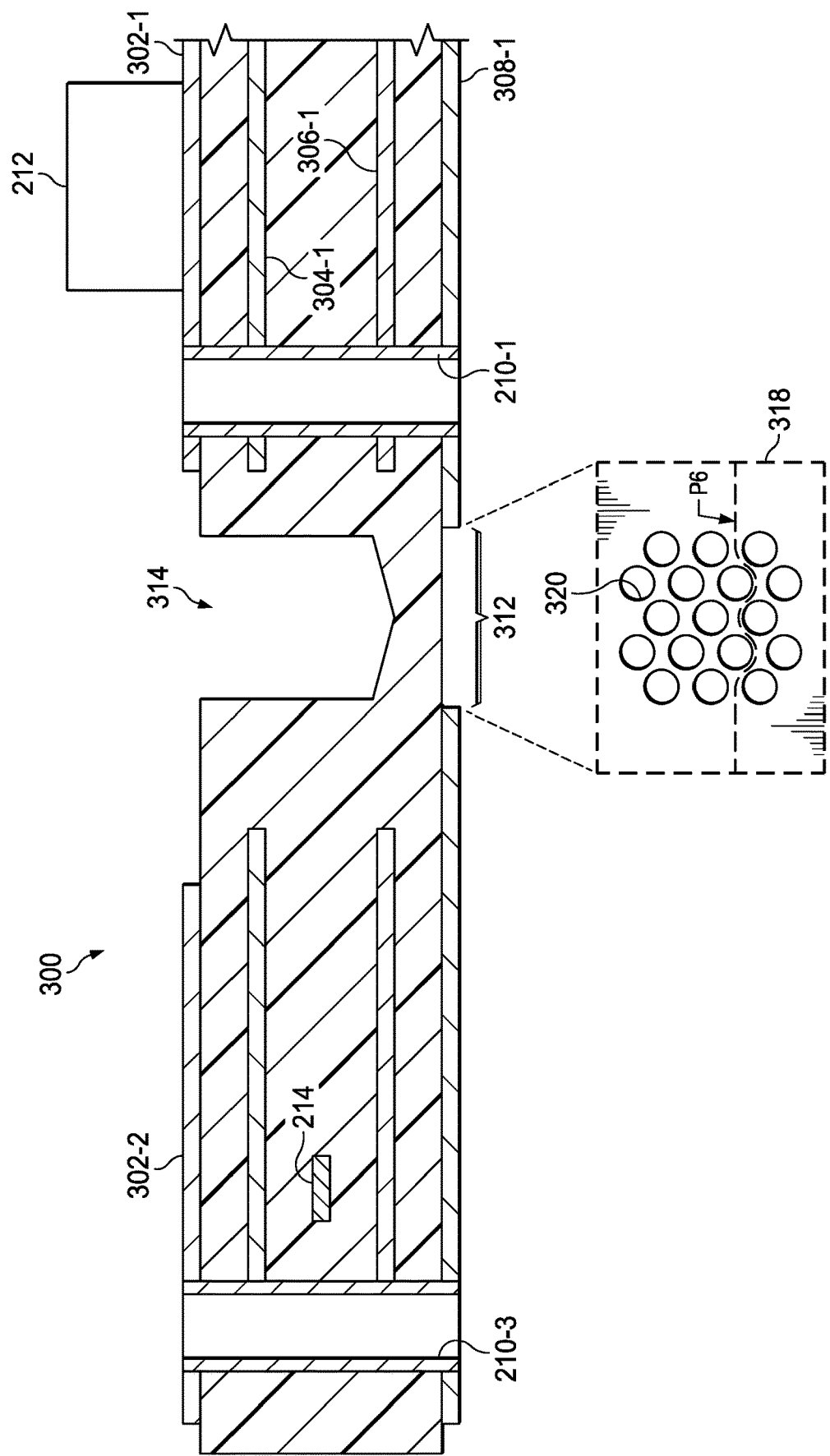
FIG. 5 is a closeup side cutaway view of a printed circuit board (PCB) configured with a trench dividing three layers of traces, moating of traces and a perforated ground plate, illustrating paths for limiting heat transfer from a heat source to a stripline trace.

Remove Dielectric Material to Minimize Thermal Conduction Between Heat Source and Trace Referring to FIGS. 4 and 5, dielectric material in PCB 300 can transfer 10 times more heat compared to air. In some embodiments, dielectric material is removed from PCB 300 where not needed. This can be implemented by a series of drilled holes, or a milled trench 314 formed partially in PCB 300. In some embodiments, trench 314 is formed in PCB 300 relative to the reference plane moat described above, and it only goes to the depth of the layer that is being protected. In this invention, it can be seen that by forming trench 314, thermally conductive material is removed, which reduces both the rate of heat transfer and the amount of heat that can be transferred to reference planes 302-2, 304-2 and 306-2 located on the opposite side of trench 314 from heat source 212. Plane 302-2 is used as a heat sink to remove heat from trace 204 area through via 210-3. In some embodiments, the combination of dielectric moat or trench 314, plane moating such that reference planes 302-2, 304-2 and 306-2 have reduced capacity for heat transfer, plane perforation 312 and outer layer plane used as heat sink may form a total solution to reduce high speed loss by minimizing heat transfer.

Trench 314 may be formed through any number of layers less than the total number of layers in PCB 110. For example, as depicted in FIG. 4, PCB 300 may be formed with four layers and trench 314 may be formed through three layers. This provides enough thermal benefits without reducing routability or board density. For example, a 30 mil deep trench 314 (relative to a first surface associated with trace 302-1 and reference plane 302-2) that is designed to protect high-speed routing is not impacting power delivery or routing below the trench 314.

Referring to FIG. 5, PCB 300 may utilize ground plate 318 to reduce crosstalk between traces. Ground plate 318 may have a larger surface area to function as part of a return path for current from components on PCB 300. As depicted in FIG. 5, in some embodiments, ground plate 318 may be formed with a plurality of circular openings 320 that cause heat to travel in a curvilinear path. In other embodiments (not shown) ground plate 318 may be formed with perforations such as discrete segments such that heat must travel in a non-linear path P6 from heat source 212 to stripline trace 214.

Figure 6:
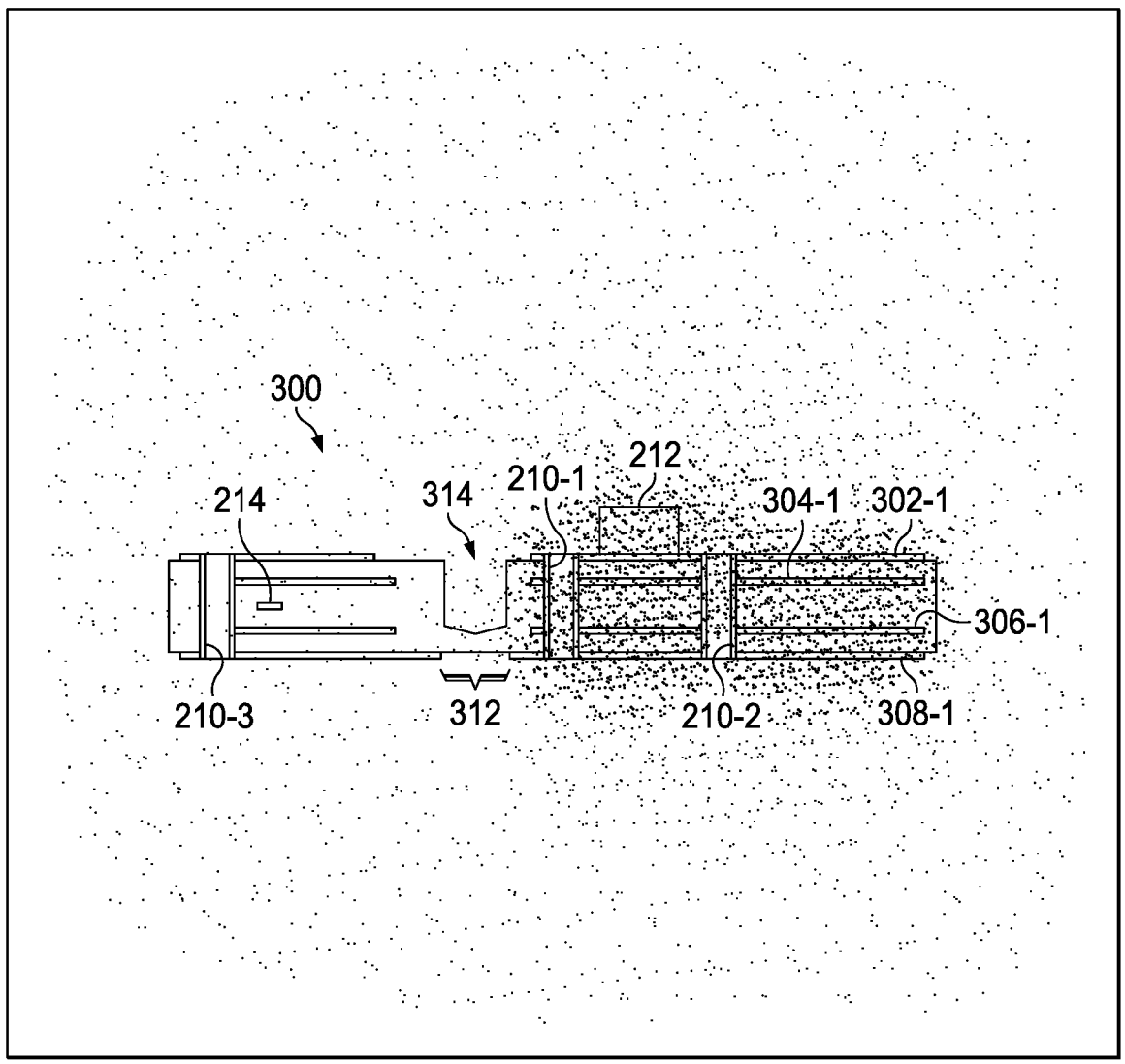
FIG. 6 is a temperature profile of a printed circuit board, illustrating heat distribution due to limiting heat transfer from a heat source to a stripline trace.

FIG. 6 depicts a temperature profile for PCB 300 formed with trench 314, with ground plate 318 having openings 320. PCB 300, like PCB 110, may be formed with stripline trace 214 being 75 mils away from heat source 212. Comparing the temperature profile of FIG. 6 with the temperature profile of FIG. 3, PCB 300 may still have high temperatures on a first side of trench 314 but may have much lower temperatures on the second side of trench 314, wherein signal integrity for stripline trace 214 on the second side of trench 314 is maintained.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A printed circuit board (PCB) with a heat source mounted on the PCB, the PCB comprising:
    a substrate having a length between a first end and a second end, a width between a first edge and a second edge and a thickness between a first surface and a second surface, the substrate comprising a plurality of layers of a dielectric material;
    a trench formed partially in the substrate, wherein:
        at least one layer of the plurality of layers is continuous over the length of the substrate;
        the trench has a depth less than the thickness of the substrate; and
        the trench divides a set of layers of the plurality of layers, wherein a first portion of each layer of the set of layers is on a first side of the trench and a second portion of each layer of the set of layers is on a second side of the trench;
    a plurality of traces formed on the plurality of layers, wherein a first set of traces of the plurality of traces is formed on the first portion of the set of layers on the first side of the trench, a second set of traces of the plurality of traces is formed on the second portion of the set of layers on the second side of the trench and a third set of traces of the plurality of traces is formed on the at least one continuous layer, wherein each trace in the third set of traces comprises a first portion on the first side of the trench, a second portion on the second side of the trench, and a perforated ground plate defining a continuous non-linear power conduction path between the first portion and the second portion;
    a plurality of vias, each via connecting two or more traces of the plurality of traces, wherein:
        at least one via is formed on the first side of the trench and is configured to connect the first set of traces and the third set of traces; and
        at least one via is formed on the second side of the trench and is configured to connect the second set of traces and the third set of traces.

2. The PCB of claim 1, wherein the perforated ground plate comprises a plurality of drilled openings defining the continuous non-linear conduction path as a curvilinear path.

3. The PCB of claim 1, wherein the perforated ground plate comprises a set of discrete segments defining the continuous non-linear power conduction path.

4. The PCB of claim 1, wherein the first set of vias are located proximate the first end of the substrate and the second set of vias are located proximate the second end of the substrate.

5. The PCB of claim 1, wherein heat source is mounted on the first surface and the at least one continuous layer is opposite the first surface.

6. A method for manufacturing a printed circuit board (PCB), the method comprising:
    forming a substrate having a length between a first end and a second end, a width between a first edge and a second edge and a thickness between a first surface and a second surface, the substrate comprising a plurality of layers of a dielectric material;
    forming a trench partially in the substrate, wherein:
        at least one layer of the plurality of layers is continuous over the length of the dielectric material;
        the trench has a depth less than the thickness of the substrate; and
        the trench divides a set of layers of the plurality of layers, wherein a first portion of each layer of the set of layers is on a first side of the trench and a second portion of each layer of the set of layers is on a second side of the trench;
    forming a plurality of traces on the plurality of layers, wherein a first set of traces of the plurality of traces is formed on the first portion of the set of layers on the first side of the trench, a second set of traces of the plurality of traces is formed on the second portion of the set of layers on the second side of the trench and a third set of traces of the plurality of traces is formed on the at least one continuous layer, wherein each trace in the third set of traces comprises a first portion on the first side of the trench, a second portion on the second side of the trench, and a perforated ground plate defining a continuous non-linear power conduction path between the first portion and the second portion;
    forming a plurality of vias, each via connecting two or more traces of the plurality of traces, wherein:
        at least one via is formed on the first side of the trench and is configured to connect the first set of traces and the third set of traces; and
        at least one via is formed on the second side of the trench and is configured to connect the second set of traces and the third set of traces.

7. The method of claim 6, wherein the ground plate comprises a plurality of drilled openings defining a curvilinear power conduction path.

8. The method of claim 6, wherein the ground plate comprises a set of discrete segments defining the continuous non-linear power conduction path.

9. The method of claim 6, further comprising forming a first set of the plurality of vias proximate a first end of the PCB and forming a second set of the plurality of vias proximate a second end of the substrate.

10. The method of claim 6, wherein the heat source is mounted on the first surface and the at least one continuous layer comprises the second surface opposite the first surface.

\* \* \* \* \*